United States Patent [19]

Coe

[11] Patent Number: 4,679,872
[45] Date of Patent: Jul. 14, 1987

[54] CYLINDRICAL BACK PLANE STRUCTURE FOR RECEIVING PRINTED CIRCUIT BOARDS

[76] Inventor: Larry D. Coe, 1957 E. Oxford, Tempe, Ariz. 85283

[21] Appl. No.: 822,655

[22] Filed: Jan. 27, 1986

[51] Int. Cl.⁴ .................... H01R 23/70; H01R 25/00
[52] U.S. Cl. ...................................... 439/61; 439/651
[58] Field of Search ............... 339/17 LM, 17 M, 20, 339/24, 21 R, 22 R, 22 B, 92 M, 156 R, 74 R, 75 M, 75 MP, 198 C; 361/407, 413, 415; 174/88 B

[56] References Cited

U.S. PATENT DOCUMENTS

| | | | |
|---|---|---|---|
| 3,180,924 | 4/1965 | Rowe | 339/22 B |
| 3,265,936 | 8/1966 | Lazar et al. | 361/413 |
| 3,272,933 | 9/1966 | Henderson | 200/46 |
| 3,973,818 | 8/1976 | Soquenne | 339/24 |
| 4,174,143 | 11/1979 | Hicks, Jr. et al. | 339/92 M |
| 4,214,799 | 7/1980 | Biche | 339/20 |

Primary Examiner—Neil Abrams
Attorney, Agent, or Firm—Cahill, Sutton & Thomas

[57] ABSTRACT

A cylindrical back plane structure includes a plurality of conductive spiders, each having a plurality of conductive legs, each of which makes electrical contact with an edge connector conductor of a printed circuit board plugged into the cylindrical back plane. The conductive spiders are stacked in alternating fashion with a plurality of insulating disks, so that each conductive spider is insulated from the others. Corresponding legs of alternate conductive spiders are aligned with each other. The outer conductive leg portions of adjacent conductive spiders are aligned with corresponding contact conductors of a printed circuit board. The cylinder back plane structure provides an economical, mechanically rigid, back plane structure with very short, low capacitance, low inductance, balanced signal paths to all printed circuit boards that are plugged into the cylindrical back plane structure.

15 Claims, 16 Drawing Figures

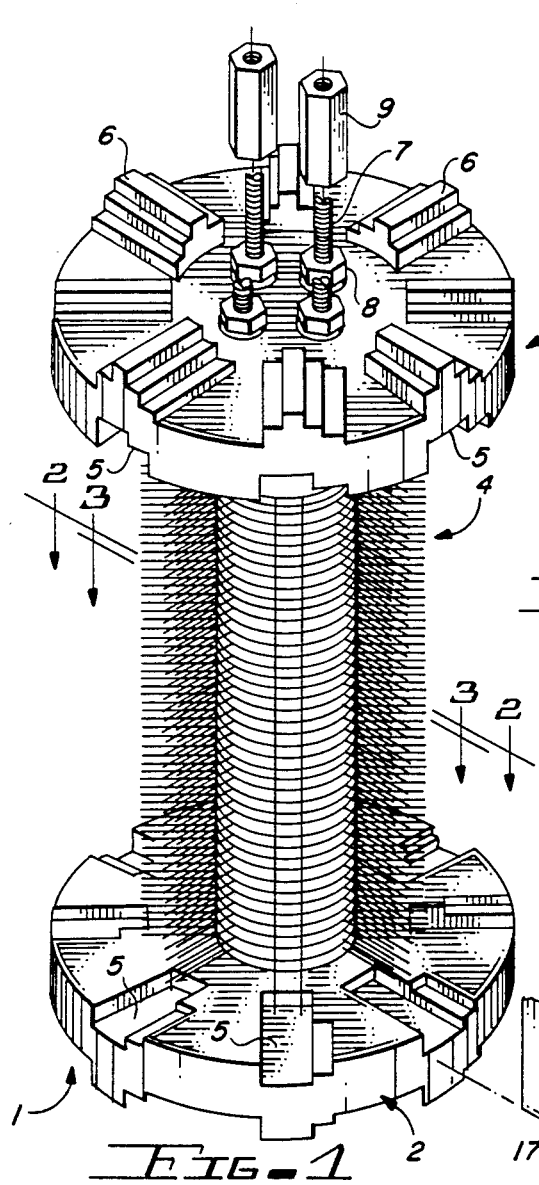
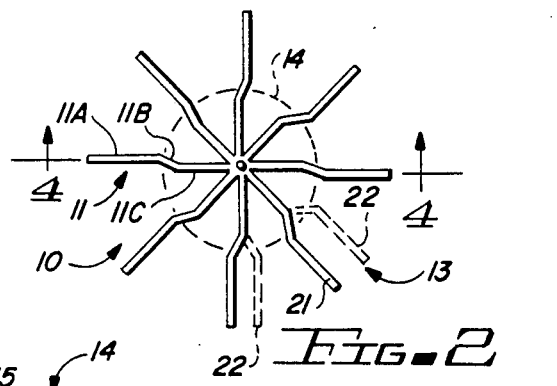
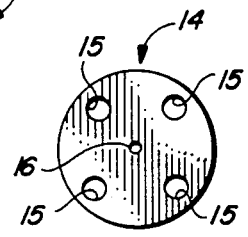
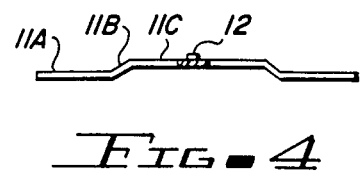
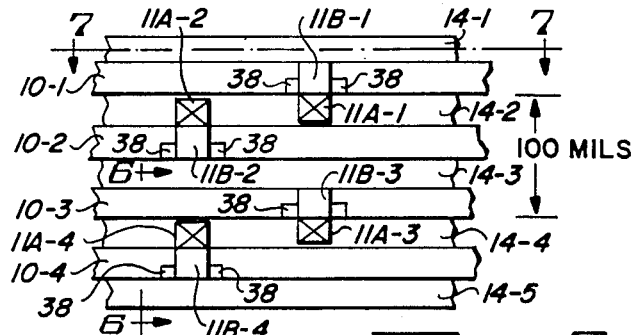
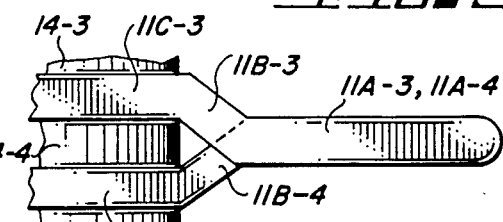
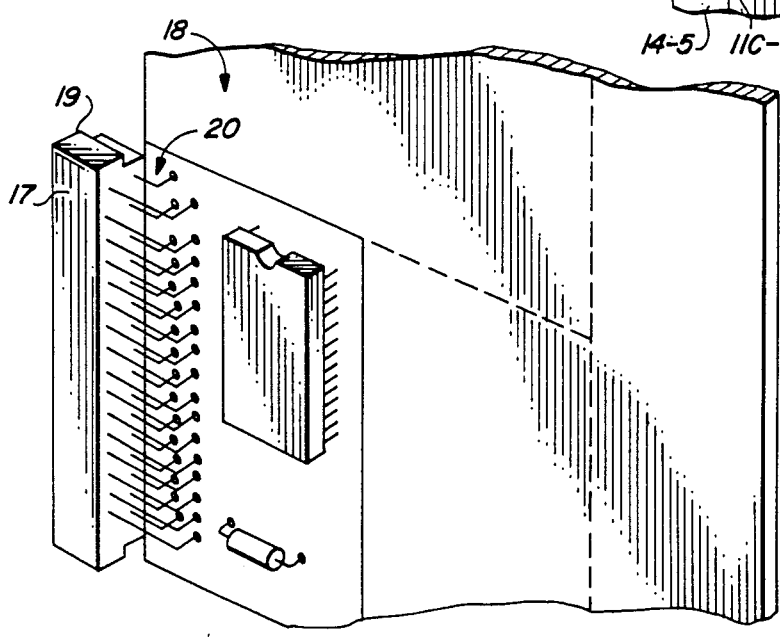
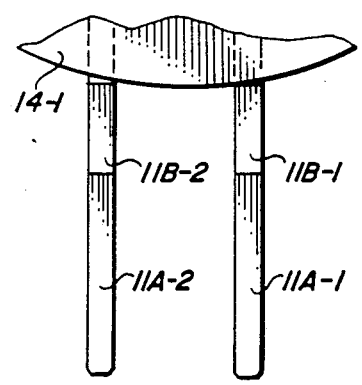

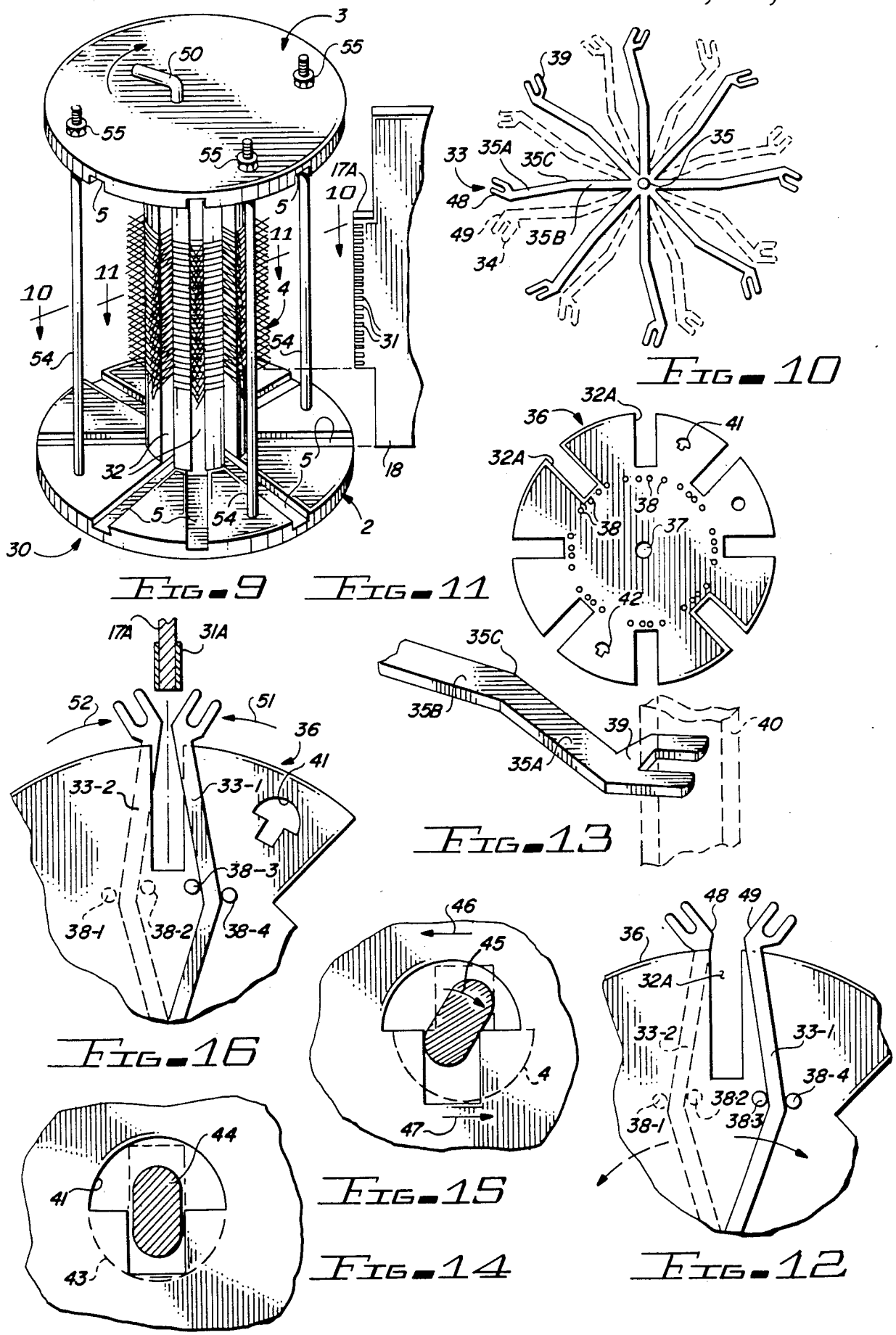

CYLINDRICAL BACK PLANE STRUCTURE FOR RECEIVING PRINTED CIRCUIT BOARDS

BACKGROUND OF THE INVENTION

The invention relates to "back planes" and "mother boards" into which a plurality of individual printed circuit boards can be plugged, and more particularly to an improved cylindrical back plane structure for receiving printed circuit boards in generally radial relationship thereto. Most complex state-of-the-art electronic equipment is manufactured by mounting individual components on printed circuit boards. The components are interconnected to accomplish various desired functions, and also are appropriately connected to edge connectors by means of which the individual printed circuit boards can be plugged into mating connectors of "back planes" or "mother boards". Those skilled in the art know that it is common to partition various subfunctions of an electronic system onto various individual printed circuit boards. For example, the memory of a personal computer can be expanded by plugging in additional "memory boards" into additional "slots" that have been made available in the back plane. Although the technique of plugging a plurality of spaced PC boards, each in parallel relationship to the others, and each perpendicular to the back plane, is widely used, there are some problems with this approach. One problem is that a substantial amount of force must be exerted upon a particular printed circuit board in order to plug it into a suitable connector of the back plane. The back plane, which itself is actually simply a rigidly mounted printed circuit board, is inevitably flexed when a printed circuit board is plugged into or removed therefrom. Such flexing can produce hairline cracks in the conductors of the back plane, breaking electrical connections or causing unreliable intermittent open circuits. Adequate cooling of the structure, including the back plane and all of the printed circuit boards plugged therein, presents problems. A major problem of the conventional structure described above is that, since the individual printed circuit boards must be spaced far enough apart to allow efficient cooling, or to allow clearance for tall components to be mounted thereon, signal conductors that are common to different plugged in printed circuit boards must be quite long and have larger amounts of capacitance and inductance associated therewith than is desirable for high speed circuitry. For example, in common conductors that carry high current, the voltage drops across the relatively high resistance, and/or high inductance of the long conductors can cause problems. For example, troublesome "ground loops" may occur as a result of such voltage drops. Such high resistance and/or high inductance can produce undesirably high voltage drops as a result of low currents, if sensitive receiving circuitry is connected to such conductors.

Radial designs for connecting electronic components to a central bussing scheme have been proposed, as indicated in U.S. Pat. Nos. 3,272,933 and 3,265,936. However, the art has not provided a practical, inexpensive cylindrical or radial back plane structure that could be utilized to replace the above-described conventional planar back plane devices.

Thus, there is an unmet need for an improved, economical, easily cooled rigid back plane structure that allows use of the shortest possible common conductors for conducting signals between different plugged-in or bonded in or soldered in printed circuit boards.

SUMMARY OF THE INVENTION

Accordingly it is object of the invention to provide an improved back plane structure that provides an short, balanced signal paths from the back plane to some or all printed circuit boards that are plugged into the back plane structure.

It is another object of the invention to provide an improved back plane structure that allows low insertion forces for plugging in printed ciruit boards and effectuates high connector contact forces on plugged-in printed circuit board edge connectors.

It is another object of the invention to provide an improved back plane structure that eliminates ground loops.

It is another object of the invention to provide an improved back plane structure that can receive female inverse Eurocard connectors.

It is another object of the invention to provide an improved back plane structure that is inherently more rigid than conventional prior planar back plane structures.

Briefly described, and in accordance with one embodiment thereof, the invention provides an improved, generally cylindrical back plane structure for receiving a plurality of printed circuit boards, wherein a plurality of conductive spiders are disposed in alternating, aligned fashion between and in abutment with respective alternate insulating disks, wherein each of the legs of a particular conductive spider contacts a corresponding connector conductor of a respective printed circuit board plugged into the back plane structure. In a described embodiment of the invention, the stack of aligned conductive spiders and insulators is disposed between two circular end plates, each end plate having radial guide slots aligned with the legs of the conductive spiders for receiving and guiding the edge connector or other type of connector so that the legs are precisely aligned with the appropriate connector conductors as the printed circuit board is plugged in to the back plane structure. The conductive spiders are arranged in pairs, each pair including an upper conductive spider and a lower conductive spider that abut the upper and lower surfaces, respectively, of a particular insulative disk. In one described embodiment of the invention, each of the legs of an upper spider is offset downward so that the outer portion of that leg is aligned with the abutted insulative disk, and also is offset to a first side of the inner portion of that leg. The outer portion of the leg of a lower spider is offset upward so that it is aligned with the same insulative disk, and also is offset to a second side, so that the outer portions of the legs of each such pair of spiders are arranged in parallel pairs. The spacing between each pair of outer leg portions is selected so that such outer leg portions will contact edge connector conductors on the opposite sides of an edge connector of a printed circuit board or the conductors of a two piece connector.

In another described embodiment of the invention, the upper surface of each of the insulative disks includes a plurality of pairs of bosses. Each of the legs of the conductive spider abutting that surface is positioned between the two bosses of a corresponding pair. A cam assembly extending through holes with inner camming surfaces in each of the insulative disks causes alternate insulative disks to rotate a few mils in opposite directions when the cam mechanism is actuated, thereby forcing outer adjacent leg members of each pair together after the printed circuit boards have been inserted therebetween, thereby substantially increasing the contact pressure between the outer spider leg portions and the connector conductors of the printed circuit board. Easy insertion of printed circuit board edge connectors is achieved, with reduced wiping pressure that results in longer contact life and allows use of less gold or other precious metal on the connector conductor surfaces, yet provides improved, more reliable contact between the back plane conductors and the printed circuit board conductors.

The described back plane structure can be incorporated in a housing containing an entire electronic apparatus, such as a computer, or can be housed in a separate housing and connected by a cable to a main electronic apparatus, such as a computer.

BRIEF DESCRIPTION OF THE DRAWINGS

FIG. 1 is a perspective view of an assembled back plane structure of the present invention.

FIG. 2 is a plan view of a conductive spider used in the back plane structure of FIG. 1.

FIG. 3 illustrates an insulating disk used in the structure of FIG. 1.

FIG. 4 illustrates an edge view of one of the conductive spider shown in FIG. 2.

FIG. 5 is a partial enlarged side view useful in explaining the detailed structure of the spider and insulating disk assembly of FIG. 1.

FIG. 6 is a partial section view taken along section line 6—6 of FIG. 5.

FIG. 7 is a partial section view taken along section line 7—7 of FIG. 5.

FIG. 8 is a partial perspective view illustrating a connector that is attached to a printed circuit board and can be inserted into a pair of guide slots of the back plane structure shown in FIG. 1.

FIG. 9 is a perspective view illustrating another embodiment of the invention that accepts common printed circuit boards with etched edge connectors.

FIG. 10 is a plan view illustrating a pair of conductive spiders used in the back plane structure of FIG. 9.

FIG. 11 is a plan view of an insulative disk that can be used in conjunction with the conductive spider shown in FIG. 10

FIG. 12 is a partial plan view illustrating a portion of one insulative disk of the type shown in FIG. 11 and corresponding legs of a pair of conductive spiders of the type shown in FIG. 10 with a cam assembly in a relaxed configuration.

FIG. 13 is an enlarged partial perspective view illustrating a technique for reliably shorting two conductive spiders together.

FIG. 14 is a partial plan view illustrating the cam of the back plane structure of FIG. 9 in a relaxed position.

FIG. 15 is a partial plan view useful in describing the actuation of the cam included in the embodiment of FIG. 9.

FIG. 16 is a partial plan view showing the structure of FIG. 12 with the cam in its actuated position with a printed circuit board edge connector inserted therein, to thereby increase contact pressure of the legs of the conductive spiders against the corresponding edge connector conductors.

DESCRIPTION OF THE INVENTION

Referring now to the drawings, particularly FIGS. 1-7, reference numeral 1 of FIG. 1 designates a cylindrical back plane of the present invention. Back Plane 1 includes a circular lower slotted plate 2, an upper slotted plate 3, and a large number (typically about 44 to 100) of star-shaped conductors or spiders alternately pressed between insulative disks, and collectively designated by reference numeral 4. The assembly shown in FIG. 1 is held together by four long bolts such as 7, which extend from the bottom surface of lower plate 2 to the upper surface of upper plate 3. Nuts such as 8 are tightened onto the bolts 7 to compress the star-shaped conductors and insulators together. Elongated nuts such as 9 can be provided to facilitate installation of the cylindrical back plane 1 into a cabinet with standard machine screws that extend through holes in the cabinet into the threads at the open upper ends of the elongated nuts 9.

The basic configuration of the conductive spiders is shown in FIG. 2 and FIG. 4. FIG. 2 is a section view taken along section line 2—2 of FIG. 1. Spider 10 is substantially identical to or similar to all of the other spiders. Each spider includes eight legs such as 11 extending generally radially outward from a central hub. Each leg 11 includes an inner radial portion 11C and an offset portion 11B, which is offset to either a first or second side of the axis of the radial portion 11C and is also offset either upward or downward to bring it into alignment with the plane of an insulating disk 14. Each spider leg 11 also includes an outer end 11A. The sectional view in FIG. 4 shows a downward and to the left offset 11B for the spider that abuts the upper surface of insulative disk 14. Alternate spiders such as 10 are inverted, so that the outer leg sections are offset upward and to the left, as indicated by dotted lines 22 in FIG. 2, which shows how the bottom spider 13 and top spider 10 abutting a particular insulative disk 14 have their outer leg sections such as 11A offset in opposite directions. More particularly, reference numeral 21 designates an outer leg section of top spider 10 which is offset downward and to the left. Reference numeral 22 designates an outer leg section of bottom spider 13 which is offset upward and to the right. The other seven legs of the spiders 10 and 13 are similarly aligned and offset. The outer offset end portions of the non-inverted and inverted spiders are offset downward and upward, respectively, so that they lie in the same plane as the insulating disk 14.

FIG. 3 shows the structure of the insulative disks that are disposed between successive spiders. Each insulative disk 14 has four clearance holes 15 for admitting the bolts 7. Optionally, a very short post 16 is provided in the center of the upper surface of disk 14, and a corresponding recess (not shown) is provided on the bottom surface. If these two features are provided, the recess on the bottom receives a short post 12 in the gcenter of the hub of spider 10, for the purpose of aiding alignment during assembly of the device shown in FIG. 1. The inverted spiders also have a small post (not shown) such as 12 on their upper surface for extending into the recesses at the centers of the bottom surfaces of the insulating disks 14.

The manner in which the conductive spiders and the insulating disks fit together is best seen with reference to FIGS. 5-7. In FIG. 5, an illustrative portion including insulating disks 14-1, 14-2, 14-3, 14-4, and 14-5 is shown, with non-inverted spiders 10-1 and 10-3 and inverted spiders 10-2 and 10-4 alternately positioned between the conductive disks. Reference numerals 38 designate busses such as busses 38-1 to 38-4 in FIG. 12, subsequently described. FIG. 6 shows a section view along section line 6—6 in FIG. 5, and FIG. 7 shows a section view along section line 7—7 of FIG. 5. The "x's" in FIG. 5 designate the centers of the outer ends of the outer leg sections such as 11A (FIG. 2). FIG. 6 most clearly shows how an upper or non-inverted spider undergoes a downward transition 11B-3 from its inner radial section 11C-3 and how a leg of an inverted spider undergoes an upward transition 11B-4 from its inner radial section 11C-4 so that the outer leg sections 11A-3 and 11A-4 lie in the same plane as the insulative disk 14-4 between the upper non-inverted spider and the lower inverted spider.

FIG. 8 shows a particular kind of printed circuit board connector 17 attached to one end of the printed circuit board 18. This kind of connector is referred to as an inverse Euroconnector. Connector 17 is electrically connected to an edge surface of printed circuit board 18 by means of a plurality of conductors generally designated by reference numeral 20. Reference numeral 19 designates a "keyed" end configuration that mates precisely with the g guide slots 5 in the lower surface of upper plate 3 in FIG. 1. A similar "keyed" end configuration also is provided on the lower end of connector 17 to precisely mate with the slots 5 of lower plate 2. The guide slots 5 ensure precise insertion of the connector 17 into the guide slots 5 so that the outward ends 11A of the various spider arms are precisely aligned with contact holes in female socket portion of connector 17 and make electrical contact with the appropriate connectors conductors thereof as the edge connector 17 is inserted into corresponding upper and lower slots 5.

Referring now to FIGS. 9-16, another embodiment of the invention is shown. In FIG. 9, reference numeral 30 designates a cylindrical back plane structure quite similar to the one shown in FIG. 1. Again, a plurality of spider members with conductive legs, each being the outer end of a conductive spider that is insulated from adjacent like conductive spiders by insulative disks, are positioned between upper plate 3 and lower plate 2. As before, guide slots 5 are provided in lower plate 2 and upper plate 3 for receiving the edges of a printed circuit board 18 having an edge connector 17A. Upper plate 3 and lower plate 2 are clamped together, securing the insulative disks and interleaved spider members therebetween, by means of a plurality of long bolts such as 54 and nuts such as 55. Of course, other means of clamping the plates 2 and 3 together could be provided.

However, the insulating disks, designated by reference numeral 36, have different features, including insertion slots such as 32A that are wide enough to admit edge connector 17A. Each of the insulating disks 36 has a pair of short (10 mil) posts located adjacent to the lower right-hand corner of each of the slots 32A.

Each of the spiders, such as 33 in FIG. 10, and each of the inverted spiders such as the one indicated by dotted line 34, are disposed on opposite sides of and abut the upper and lower surfaces of insulating disk 36. As best seen in FIGS. 12 and 16, each pair of posts or bosses such a 38-3 and 38-4 on the upper surface of each disk 36 locates or positions one of the legs of the conductive spider abutting the top surface. In FIGS. 12 and 16, reference numerals 38-1 and 38-2 designate bosses on the adjacent lower insulating disk. Thus, on each alternate insulating disk such as 36, the configuration of the conductive spiders abutting the upper and lower surfaces of that disk is as shown in FIG. 10. When the edge connector 17A of the printed circuit board 18 is properly inserted into cylindrical back plane structure 30, the inner edges of each adjacent pair of legs of the conductive spiders abutting the upper and lower surfaces of a particular insulative disk "wipe" and make electrical contact to the edge connector conductors such as 31 on opposite sides of edge connector 17A.

A pair of bifurcated fingers such as 39 (FIG. 10 and FIG. 13) at the outer end of each of the conductive spider legs is optional, but provides the capability of connecting an external conductor to a particular conductive spider. This capability may be useful to effectuate testing operations, or may be useful to short certain conductive spiders together. For example, in some systems there may be several ground conductors or several power supply conductors of the same voltage. It may be advantageous to short them together by means of a conductor such as the one designated by dotted lines 40.

In accordance with another aspect of the present invention, a camming system including a handle 50 (FIG. 9), is provided to allow adjacent insulative disks such as 36 to be forced to rotate slightly in opposite directions, thereby causing the outer ends of adjacent pairs of conductive spiders to be moved together, increasing the contact pressure between the edge areas such as 48 and 49 and the edge connector conductor such as 31. FIG. 12 illustrates the initial configuration of two conductive spider legs 33-1 and 33-2. They are spaced far enough apart to allow relatively easy, low force insertion of edge connector 17A into the appropriate slot 32A. Preferably, the contact areas 48 and 49 lightly wipe, and thereby clean, the edge connector conductors 31 as edge connector 17A is inserted into slot 32A. When the cam mechanism is actuated by turning handle 50 in the direction indicated by the adjacent arrow, the upper disk rotates counterclockwise in the direction of arrow 51 in FIG. 16. The adjacent lower insulative disk moves clockwise in the direction of arrow 52 in FIG. 16. This causes conductive spider legs 33-1 and 33-2 to be forced closer together, pressing the contact areas 49 and 48, respectively, tightly against edge connector conductors 31A, 31B, respectively, greatly improving the reliability of the electrical connection. The resilience of the conductive material (such as beryllium copper bronze, of which the conductive spiders are constructed results in essentially uniform contact pressures of all of the conductive spider legs against all of the corresponding edge connector conductors.

In the described embodiment of the invention, the center-to-center spacings of the edge connector conductors 31 is 100 mils. As can be easily seen from FIG. 5, the desired 100 mil spacing between the spider legs is achieved if they are composed of 25 mil thick material and the insulative disks such as 36 are also 25 mils thick.

The insulative disks 36 can be easily manufactured by punching them out of insulative material such as nylon that is 25 mils thick. Similarly, the conductive spiders, both as shown in FIGS. 2 and 10, can be made by stamping them out of conductive material, such is beryllium copper, that is 25 mils thick.

The invention described has far greater inherent structural strength than conventional flat printed circuit board back planes. The forces exerted on the back plane structure shown in FIGS. 1 and 9 do not flex when printed circuit boards are inserted and thereby do not cause hairline breaks such as those that often occur in the solder joints between conventional back plane boards and connectors, and thereby do not produce open circuits, as sometimes occurs with conventional flat back plane structures. More importantly, the shortest possible lengths of common conductors of the printed circuit boards plugged into the back plane is achieved by either of the structures described herein. Consequently, higher signal speeds are possible, since there is less resistance, capacitance, and inductance associated with the conductive spiders than is the case with the necessarily long printed conductors that make common connections to plugged-in printed circuit boards in conventional back plane structures. The structural elements of the described back plane structures, namely the conductive spiders and the insulative disks, can be made economically by stamping them out of appropriate material. Assembly of the back plane structure is straightforward and convenient. The number of legs of each spider can be far greater than the number shown. The system is adaptable to miniaturization. The back plane connectors can be of either the male or female variety, or welded or soldered contacts between the printed circuit board edge connectors and the conductive spider legs can be provided, depending upon the particular application. A desirable objective of nearly zero insertion force can be accomplished by the embodiment of the invention described with reference to FIGS. 11-16 in an easily implemented, economical structure that, despite its "zero insertion force capability", provides high pressure, reliable contact between the back plane conductors and the printed circuit board edge connector conductors. The short conductor lengths and the capability of externally shorting certain conductive spiders together makes it possible to eliminate or reduce the occurrence of ground loops that often cause troublesome circuit malfunctions. The radial structure of the plugged-in printed circuit boards inherently provides much greater spacing between most of the area of adjacent printed circuit boards, making forced air cooling much more effective, and allowing placement of higher power components on each printed circuit board, especially on the outermost portions thereof. Back plane printed circuit board failures associated with solder bridges, hairline shorts, and fractures are eliminated. The low pressure wiping action achievable by some embodiments of the invention cleans contacts when the boards are inserted or removed The "zero insertion force" that is achievable minimizes the loss of precious metal, such as gold, from the circuit board contacts. The short signal paths and low inductance and capacitance associated therewith reduces the load on interface drivers, lowering overall costs associated with drivers. The balanced signal paths to the various PC boards can, in some instances, reduce the need for resynchronizing circuits needed to compensate for different delays that otherwise would result from different length signal paths from a common conductor to different printed circuit boards.

While the invention has been described with reference to several particular embodiments thereof, those skilled in the art will be able to make various modifications to the described embodiments of the invention without departing from the true spirit and scope thereof. It is intended that apparatus and methods which are equivalent to the embodiments described herein in that similar elements and steps perform substantially the same function in substantially the same way to achieve substantially the same result are to be considered within the scope of the invention. For example, the back plane configurations need not be cylindrical, but could have polygonal cross-sections. Not all of the connectors need be rigidly attached to printed circuit boards; some may be cable connectors.

It is not necessary that the spider legs be oriented radially outward at uniform angles. At some cases, it may be desirable to provide differing angles between adjacent legs. In some instances, a generally semicylindrical arrangement might be preferably to the generally cylindrical embodiments shown. In certain instances, it might be desirable to provide a structure for the spiders in which certain conductive legs of a particular spider are insulated from other conductive legs of that same spider.

I claim:

1. A back plane apparatus for receiving a plurality of electrical connectors, each having a plurality of connector connectors, the back plane apparatus comprising in combination:
   (a) a plurality of conductive spider members each having a conductive hub and a plurality of narrow, elongated conductive legs extending radially outwardly therefrom;
   (b) a plurality of insulative disks disposed between the respective conductive spider members and insulating each conductive spider member from the adjacent ones, the conductive spider members and insulative disks forming a vertical stack,;
   (c) a plurality of printed circuit boards each having an electrical connector attached along an edge thereof, each electrical connector having a plurality of connector conductors for electrically contacting a conductive leg of a respective one of the conductive spider members, the connector conductors of each electrical connector being arranged in pairs, the connector conductors of each pair being located side-by-side, outer portions of conductive legs of alternate conductive spider members being offset downward and sideways in one direction and outer portions of the conductive legs of the other conductive spider members being offset upward and sideways in the opposite direction, adjacent outer conductive leg portions being located side-by-side and respectively electrically contacting the side-by-side connector conductors of a pair;
   (d) means for clamping the conductive spider members and the insulative disks together in interleaved relationship to each other and maintaining the conductive legs in predetermined aligned relationship with each other; and
   (e) a plurality of guide means for precisely guiding each of the electrical connectors as it is plugged into the back plane apparatus so that the conductive legs are precisely aligned with and make reliable electrical contact with corresponding connector conductors of respective plugged-in electrical connectors.

2. The back plane apparatus of claim 1 wherein the plurality of guide means are included within the clamping means, and wherein the clamping means includes an upper plate and a lower plate clamping the conductive spider members and the insulative disks together, and wherein the plurality of guide means include a plurality of pairs of vertically aligned radial slots disposed in the upper and lower surfaces of the lower and upper plates, respectively.

3. The back plane apparatus of claim 2 wherein the electrical connectors are inverse Euroconnectors.

4. The back plane apparatus of claim 2 including means for maintaining individual conductive legs of first and second ones of the conductive spider members abutting surfaces of first and second adjacent ones of the insulative disks in fixed relationship to the first and second insulative disks.

5. The back plane apparatus of claim 4 wherein the leg maintaining means includes a pair of short bosses extending from surfaces of the first and second insulative disk on either side of each conductive leg.

6. The back plane apparatus of claim 4 including means for slightly rotating one of the first and second insulative disks relative to the other to press corresponding conductive legs of the first and second conductive spider members tightly against a pair of a connector conductors of an electrical connector plugged into the back plane apparatus.

7. The back plane apparatus of claim 2 wherein the conductive spiders are composed of beryllium copper material, and the insulative disks are composed of plastic material.

8. The back plane apparatus of claim 2 wherein each of the conductive legs has a bifurcated end portion, the back plane apparatus further including shorting means for electrically connecting the bifurcated end portions of at least two of the shorting means of different conductive spider members together.

9. The back plane apparatus of claim 6 wherein the insulative disk rotating means includes a plurality of openings in the insulative disks, each of the openings having a camming surface, and also includes a camming rod extending through the openings and having a plurality of camming surfaces that engage the camming surfaces of the insulative disks and rotate alternate insulative disks in opposite directions in response to rotation of the camming rod.

10. The back plane apparatus of claim 9 wherein the insulative disk rotating means includes a means connected to the camming rod for rotating the camming rod to cause the various conductive legs to tightly close upon various corresponding connector conductors of a plurality of electrical connectors that are plugged into the back plane apparatus.

11. A method of connecting a plurality of electrical connectors attached to a plurality of printed circuit boards, respectively, to a back plane apparatus, the method comprising the steps of:

(a) providing a plurality of conductive spider members each having a conductive hub and a plurality of narrow, elongated conductive legs extending radially outwardly therefrom, and a plurality of insulative disks, producing offset that is downward and sideways in one direction in outer portions of conductive legs of alternate conductive spider members, and producing offset that is upward and sideways in the opposite direction in outer portions of the conductive legs of the other conductive spiders;

(b) stacking the conductive spider members and insulative disks in alternate, interleaved relationship to each other and vertically aligning selected groups of corresponding conductive legs of respective ones of the conductive spider members so that adjacent outer conductive legs portions of adjacent conductive spider members are located side-by-side, and clamping the stacked conductive spider member and insulative disks securely together by means of a pair of clamping plates; and (c) plugging each of a plurality of printed circuit boards into the back plane apparatus in generally radially oriented relationship to the back plane apparatus, so that the side-by-side outer conductive leg portions of each pair respectively electrically contact a pair of corresponding side-by-side connector conductors of the electrical connector of that printed circuit board.

12. The method of claim 11 wherein step (c) includes guiding the electrical connectors, in order to align connector conductors thereof with corresponding conductive legs of the conductive spiders, by means of a plurality of generally radially oriented slots disposed in the clamping plates.

13. The method of claim 11 wherein the electrical connectors each have a plurality of connector conductors disposed on opposite surfaces of an insulative member, the method including providing an initial spacing between end portions of adjacent conductive legs to provide insertion gaps into which the connector conductors can be inserted, the method also including maintaining each leg of a particular conductive spider in fixed relationship to one of the insulative disks adjacent thereto.

14. The method of claim 13 including, after inserting the connector conductors of the electrical connectors into the back plane apparatus, rotating alternate insulative disks in opposite directions to force the outer portions of the leg members against corresponding connector conductors of plugged in electrical connectors to improve electrical contact between the leg members and corresponding connector conductors.

15. The method of claim 11 including providing the conductive spider members and insulative disks by punching the conductive spider members out of a sheet of thin metal and punching the insulative disks out of a thin sheet of insulative material.

* * * * *